United States Patent
Lin et al.

(10) Patent No.: US 7,357,654 B2
(45) Date of Patent: Apr. 15, 2008

(54) INTERFACE APPARATUS WITH A ROTATIONAL MECHANISM

(75) Inventors: Yu-Chuan Lin, Hsinchu Hsien (TW); Chun-Chieh Chen, Tai-Nan County (TW); Hung-Ju Shen, Taipei County (TW); Chien-Hua Wu, Miao-Li County (TW); Sheng-Lin Chiu, Nan-Tou County (TW); Huan-Tung Wang, Hsinchu County (TW); Hsin-Chih Hung, Yu-Lin County (TW)

(73) Assignee: Ritek Corporation, Hsinchu Industrial Park (TW)

( * ) Notice: Subject to any disclaimer, the term of this patent is extended or adjusted under 35 U.S.C. 154(b) by 0 days.

(21) Appl. No.: 10/605,237

(22) Filed: Sep. 17, 2003

(65) Prior Publication Data

US 2004/0105329 A1 Jun. 3, 2004

(30) Foreign Application Priority Data

Sep. 30, 2002 (TW) .............................. 91215421 U

(51) Int. Cl.
*H01R 3/00* (2006.01)
(52) U.S. Cl. ..................................... 439/164
(58) Field of Classification Search ................ 439/164, 439/13, 638, 640, 586
See application file for complete search history.

(56) References Cited

U.S. PATENT DOCUMENTS 5,975,927 A * 11/1999 Giles ........................ 439/131
6,422,763 B1 * 7/2002 Halbach et al. ............... 385/77
6,612,874 B1 * 9/2003 Stout et al. .................. 439/640
2002/0081878 A1 * 6/2002 Bruno ......................... 439/164
2002/0101405 A1 * 8/2002 Chang ........................ 346/168
2002/0104246 A1 * 8/2002 Reynolds ................. 40/642.02

FOREIGN PATENT DOCUMENTS

DE 20211121 U1 11/2002

OTHER PUBLICATIONS

"tom's hardware guide": Funkt und speichert: Gigabyte GN-WLBZ201. www.de.tomshardware.com/storage/20040327/gigabyte-funder-01.html.
"Freecom FHD-XS" datasheet. publish on Apr. 13, 2004. www.freecom.com.
"Freecom USBCard" datasheet. published on Jul. 21, 2003. www.freecom.com.

* cited by examiner

*Primary Examiner*—J. F. Uverne
(74) *Attorney, Agent, or Firm*—Jianq Chyun IP Office

(57) ABSTRACT

An interface apparatus having a rotational mechanism for connecting with an interface port in an electronic product is provided. The interface apparatus comprises a body, a connector and a rotational mechanism. The connector is used for connecting with the interface port of an electronic device. The rotational mechanism links up the body with the connector. The rotational mechanism has one to five degrees of freedom of movements. One or a multiple of rotational junctions together provides the degrees of freedom of movements in the rotational mechanism.

5 Claims, 7 Drawing Sheets

Rotational joint 402   sliding joint 404   cylindrical joint 406 spiraling joint 408   rolling joint 410   cam-wheel joint 412 ball-and-socket joint 414   plane-sliding joint 416   gear-wheel joint 418

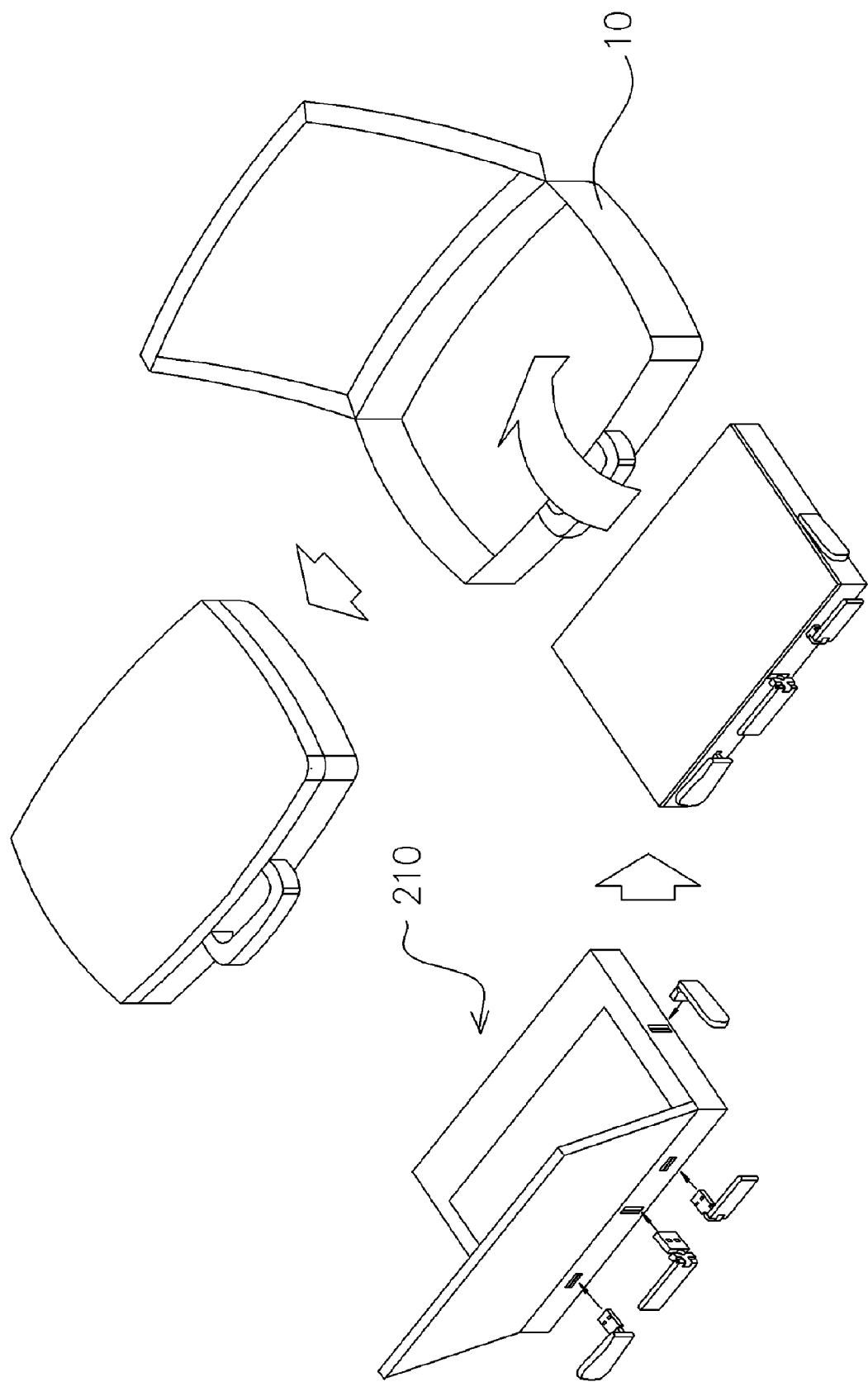

INTERFACE APPARATUS WITH A ROTATIONAL MECHANISM

CROSS REFERENCE TO RELATED APPLICATIONS

This application claims the priority benefit of Taiwan application serial no. 91215421, filed Sep. 30, 2002.

BACKGROUND OF INVENTION

1. Field of the Invention

The present invention relates to an interface apparatus. More particularly, the present invention relates to an interface apparatus with a rotational mechanism.

2. Description of the Related Art

With rapid progress in electronic technologies, many types of electronic products including servers, workstations, desktop computers, notebook computers, portable computers or industrial computer has become an indispensable part of our working or recreational life. Increasing number of people relies on notebook computers or desktop computers to access data. Through various types of interfaces, for example, the universal serial bus (USB) interface or IEEE 1394 interface, application products are sometimes hooked up with a computer. For example, portable hard drives or card readers of a digital camera or digital camcorder are connected through a USB interface or an IEEE 1394 interface apparatus.

FIG. 1 is a perspective view of a conventional interface apparatus connected to a notebook computer. As shown in FIG. 1, the interface apparatus 100 mainly comprises a body 102 and a connector 104. The body 102 is a memory module or a memory adapter, for example. In other words, the body 102 is a portable memory device or a card reader for holding memory data, for example. The connector 104 is an interface apparatus for connecting with a USB interface, an IEEE 1394 interface or some other conventional interface. The notebook computer 110 has at least an interface port 112. In general, the interface port 112 is located on either side or the back of the notebook computer 110. By plugging the connector 104 of the interface apparatus 100 into the interface port 112 of the notebook computer 110, the notebook computer 110 and the apparatus 100 are electrically connected. Thereafter, data within the interface apparatus 100 can be access through the operation of the notebook computer 110. Since the body 102 and the connector 104 has an integrative design, the interface apparatus 100 will protrude awkwardly from either side or the back of the notebook computer 110 after plugging the connector 104 into the interface port 112.

The protrusion of the interface apparatus 100 from either side of the back of the notebook computer has several obvious disadvantages, including: 1. When the notebook computer or the interface apparatus receives an accidental impact, the interface apparatus or the interface port may pick up an irreversible damage. 2. A user wishing to wrap up the notebook computer inside a protective cover (not shown) at the completion of an operation is frequently limited by the length of the interface apparatus. In other words, a user has to remove the interface apparatus from the notebook computer before the notebook computer can be placed inside a protective cover and carried around. 3. The protruding interface apparatus often tangles with adjacent connectors or wires producing a mess for the user.

SUMMARY OF INVENTION

Accordingly, one object of the present invention is to provide an interface apparatus with rotational mechanism capable of untangling from adjacent connectors and cables through rotation and/or side movements. Furthermore, the body of the apparatus may be swiveled around to contact the side of the notebook computer so that the notebook computer together with all the plugged interface apparatus can be enclosed within a protective cover for easy carriage.

To achieve these and other advantages and in accordance with the purpose of the invention, as embodied and broadly described herein, the invention provides an interface apparatus with a rotational mechanism. The interface apparatus is designed to connect with the interface port of an electronic product. The interface apparatus comprises a body, a connector and a rotational mechanism. The connector is adapted for connecting with the interface port of an electronic product. The rotational mechanism serves as a link between the body and the connector. The rotation mechanism has from one to five degrees of freedom of movements. The number of degrees of freedom of movement is conferred through one or a combination of rotational junctions.

According to one embodiment of this invention, the body of the interface apparatus is a memory module. The memory module can be a non-volatile memory module. However, the body can also be a memory adapter. Furthermore, the connector can be a universal serial bus (USB) interface or an IEEE 1394 interface. The rotational mechanism can have from one to five degrees of freedom of movements. The rotational mechanism has at least a rotational junction having from one to five degrees of freedom of movements. The rotational junction can be a rotational joint, a sliding joint, a rolling joint, a cam-wheel joint, a gear-wheel joint, a spiral joint, a cylindrical joint, a ball-and-socket joint or a plane-sliding joint.

In brief, the rotational mechanism of this invention is able to prevent the body of the interface apparatus from tangling up with neighboring connectors or cables of the notebook computer. Furthermore, the body of the interface apparatus can even be rotated to stick beside the notebook computer for ease wrapping or carrying. Moreover, the degrees of freedom movements conferred to the interface apparatus through the rotational mechanism can be utilized to reduce possible damage due to an external impact.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is a perspective view showing the sequence of steps for putting a notebook computer with attached interface apparatus all having rotational mechanism according to this invention into a briefcase to facilitate carriage.

DETAILED DESCRIPTION

Figure 1:
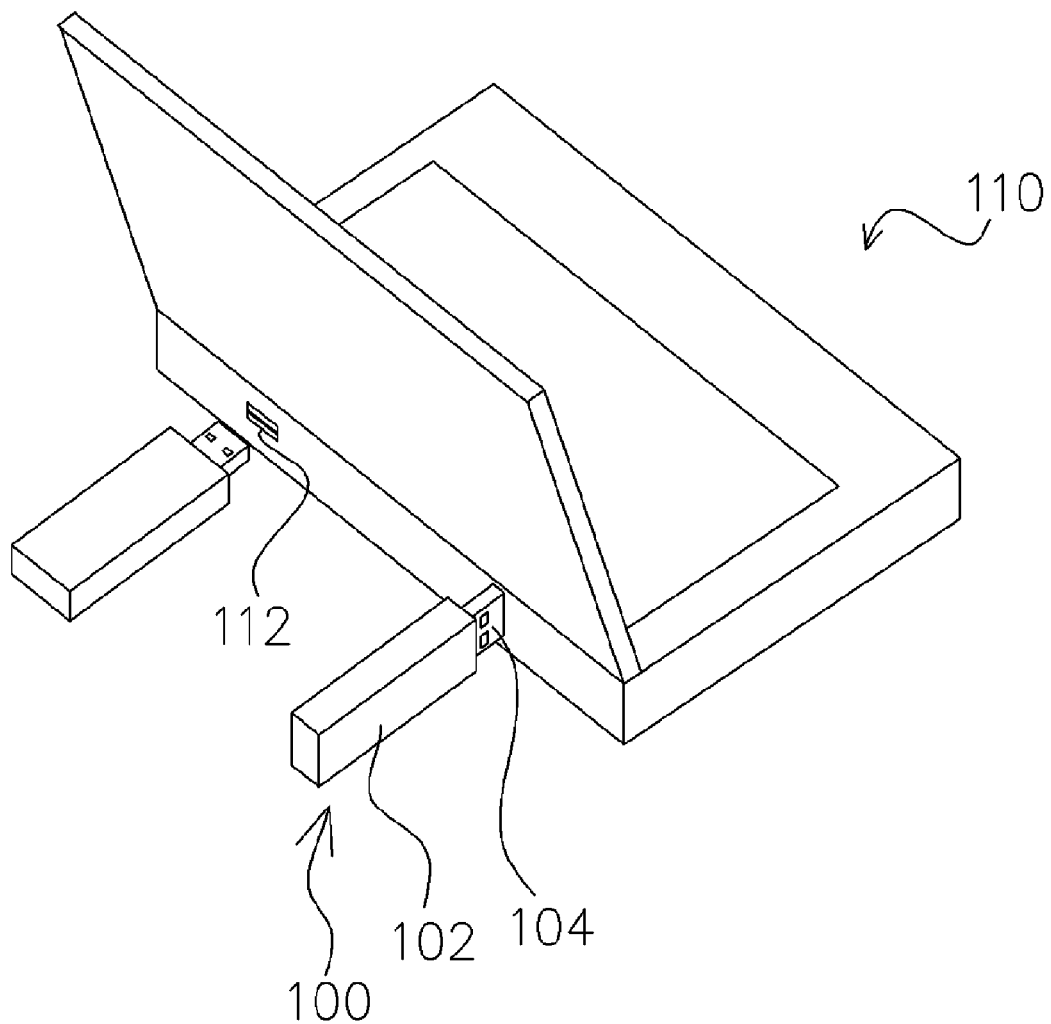
FIG. 1 is a perspective view of a conventional interface apparatus connected to a notebook computer.

Reference will now be made in detail to the present preferred embodiments of the invention, examples of which are illustrated in the accompanying drawings. Wherever possible, the same reference numbers are used in the drawings and the description to refer to the same or like parts.

Figure 2:
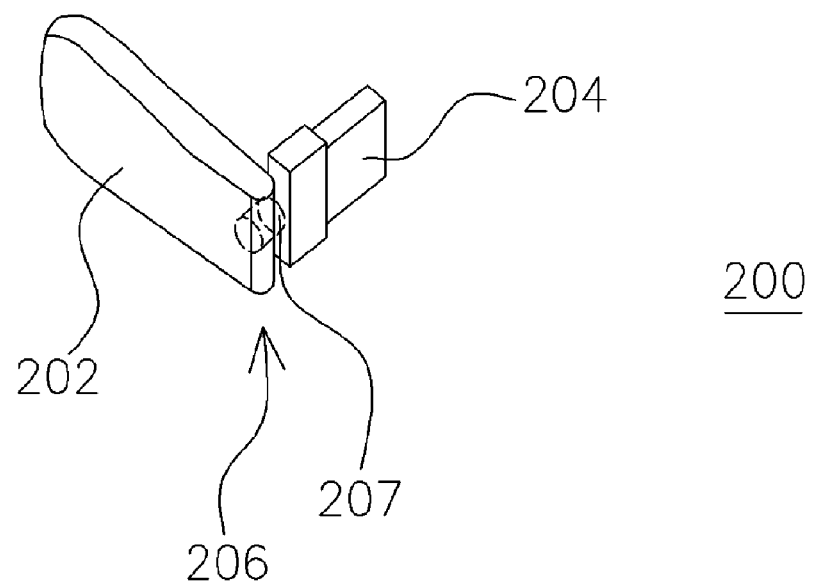
FIG. 2 is a perspective view showing an interface apparatus with a rotational mechanism (a rotational junction) according to a first embodiment of this invention.
Figure 3:
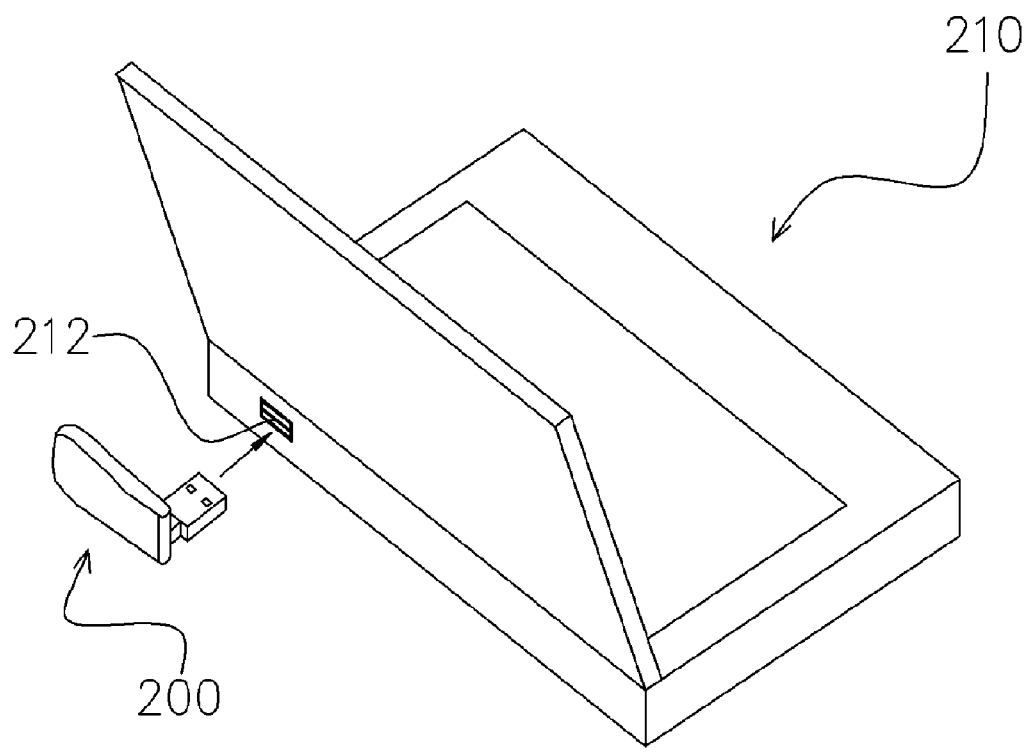
FIG. 3 is a perspective view showing an interface apparatus with rotation mechanism according to the first embodiment of this invention plugged onto a notebook computer.

FIG. 2 is a perspective view showing an interface apparatus with a rotational mechanism (a rotational junction) according to a first embodiment of this invention. FIG. 3 is a perspective view showing an interface apparatus with rotation mechanism according to the first embodiment of this invention plugged onto a notebook computer. As shown in FIGS. 2 and 3, the interface apparatus 200 mainly comprises a body 202, a connector 204 and a rotational mechanism 206. The body 202 is a memory module including a non-volatile memory module, for example. In general, data in the body 202 can be accessed through the operation of the notebook computer 210. However, the body 202 need not be limited to a memory module. In fact, the body 202 can be a memory adapter, a card reader or similar products that are available in the market as well. In addition, the connector 204 is a device suitable for connecting with an interface port 212 in the notebook computer 210 as shown in FIG. 3. When the user needs to access some data, the connector 204 of the interface apparatus 200 is plugged into the interface port 212 of the notebook computer 210. The operating system inside the notebook computer 210 then sets up proper control to transfer data into or read data out of the interface apparatus 200.

The connector 204 may deploy a general-purpose interface such as a universal serial bus (USB) interface or an IEEE 1394 interface. Furthermore, the rotation mechanism 206 serves as a connection between the body 202 and the connector 204. The rotation mechanism 206 has rotational and/or shifting function for changing the relative position between the body 202 and the connector 204.

Figure 4:
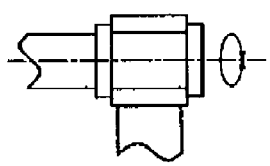
FIG. 4 is a perspective view showing various types of rotational junctions according to this invention.
Figure 4:
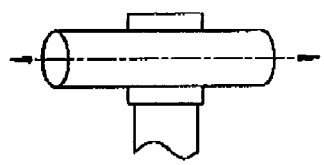
Figure 4:
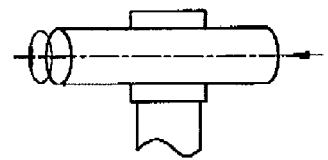
Figure 4:
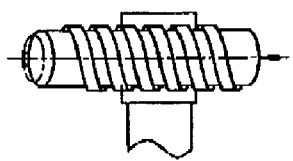
Figure 4:
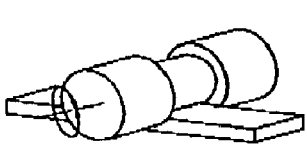
Figure 4:
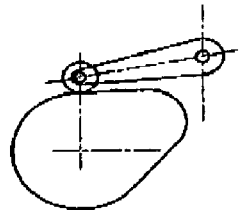
Figure 4:
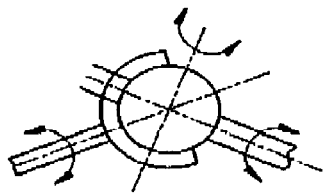
Figure 4:
Figure 4:
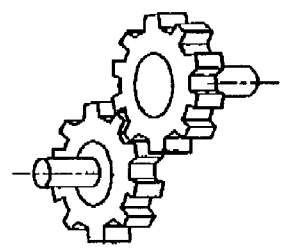
Figure 5:
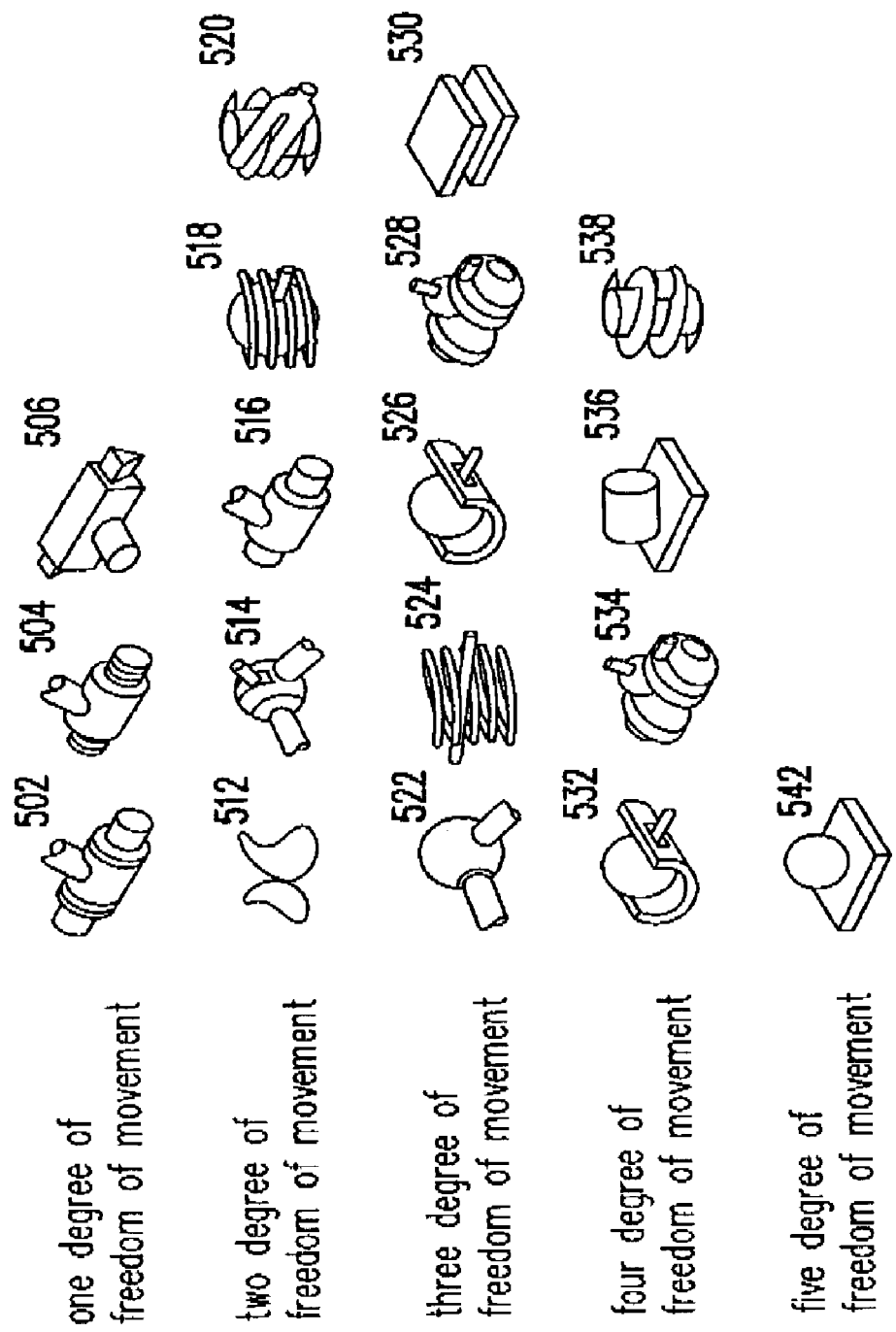
FIG. 5 is a perspective view showing various types of rotational junctions having from one to five degrees of freedom of movements according to this invention.

FIG. 4 is a perspective view showing various types of rotational junctions according to this invention. FIG. 5 is a perspective view showing varous types of rotational junctions having from one to live degrees of freedom of movements according to this invention. According to the embodiment of this invention (refer to FIGS. 2, 4 and 5), the rotational mechanism 206 is built using a rotational junction 207. There arc a variety of rotational junction designs as shown in FIG. 4. One of the following types of rotational junctions may he selected by the interface apparatus designer, namely: a rotational joint 402, a sliding joint 404, a cylindrical joint 406, a spiral joint 408, a rolling joint 410, a cam-wheel joint 412, a ball-and-socket joint 414, a plane-sliding joint 416, or a gear-wheel joint 418. Moreover, the rotational joint 207 can have one to five degrees of freedom of movements as shown in FIG. 5. Referring to FIG. 5, the device 502, 504 or 506 has one degree of freedom of movement, the device 512, 514, 516, 518 or 520 has two degrees of freedom of movement, and the device 522, 524, 526, 528 or 530 has three degrees of freedom of movement. In addition, the device 532, 534, 536 or 538 has four degrees of freedom of movement, and the device 542 has five degrees of freedom of movement. For example, a designer may select a plane-sliding joint 416 as shown in FIG. 4 to serve as a rotational joint 207. In this case, since the plane-sliding joint 416 has three degrees of freedom of movements (two sliding motions and a rotational motion), the rotational mechanism 206 also has a total of three degrees of freedom of movements.

Figure 6:
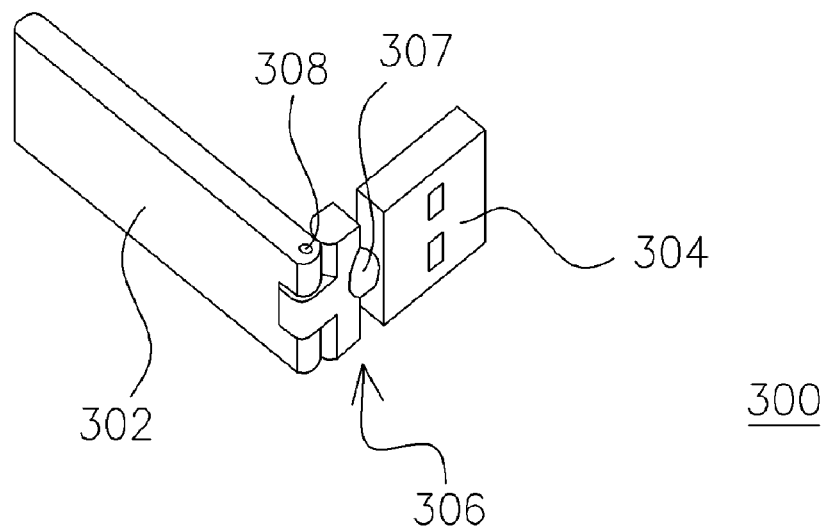
FIG. 6 is a perspective view showing an interface apparatus with a rotational mechanism (two rotational junctions) according to a second embodiment of this invention.
Figure 7:
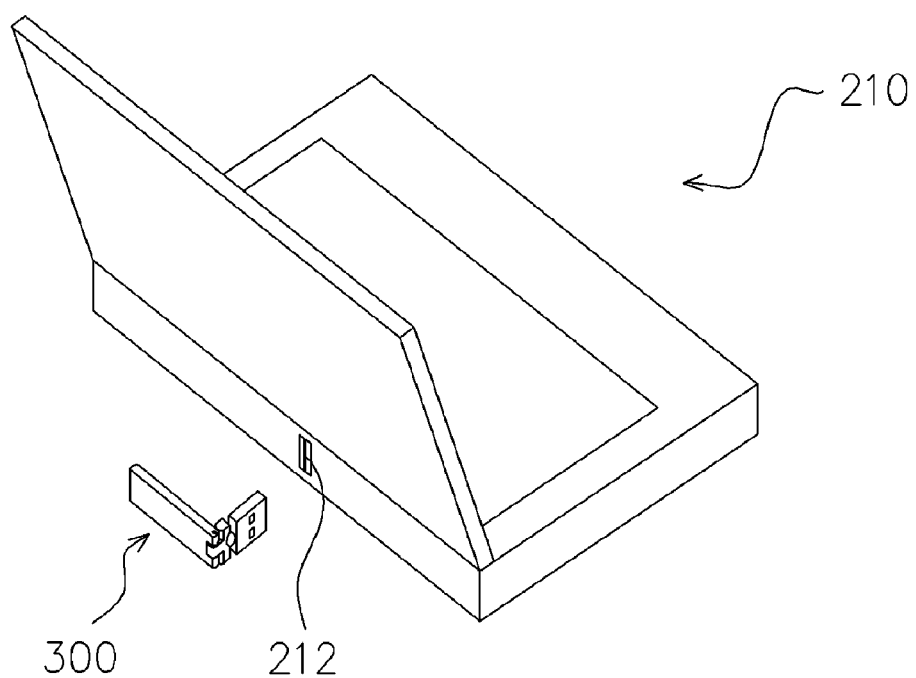
FIG. 7 is a perspective view showing an interface apparatus with rotation mechanism according to the second embodiment of this invention plugged onto a notebook computer.

However, the number of rotational junctions in the interface apparatus is not limited to one but can be two. The components and their structural relationships are similar to the one described in the first embodiment. FIG. 6 is a perspective view showing an interface apparatus with a rotational mechanism (two rotational junctions) according to a second embodiment of this invention. FIG. 7 is a perspective view showing an interface apparatus with rotation mechanism according to the second embodiment of this invention plugged onto a notebook computer. As shown in FIGS. 4, 5, 6 and 7, the rotational mechanism 306 of the interface apparatus 300 has two rotational joints 307 and 308 and the rotational joints can have a variety of selections. The rotational joints 307 and 308 can be selected from the list of joints as shown in FIG. 4. In addition, the rotational joints 307 and 308 can have one to five degrees of freedom of movements as shown in FIG. 5. For example, a designer may select a plane-sliding joint 416 having three degrees of freedom of movements (two sliding and one rotational) as shown in FIG. 4 to serve as the first rotational joints. The designer may also choose a spiral joint 408 having two degrees of freedom of movements (a sliding and a rotational) to be the second rotational joint. Consequently, the rotational mechanism 306 has a total of five degrees of freedom of movements, three from the first joint and the two from the second joint.

Figure 8:
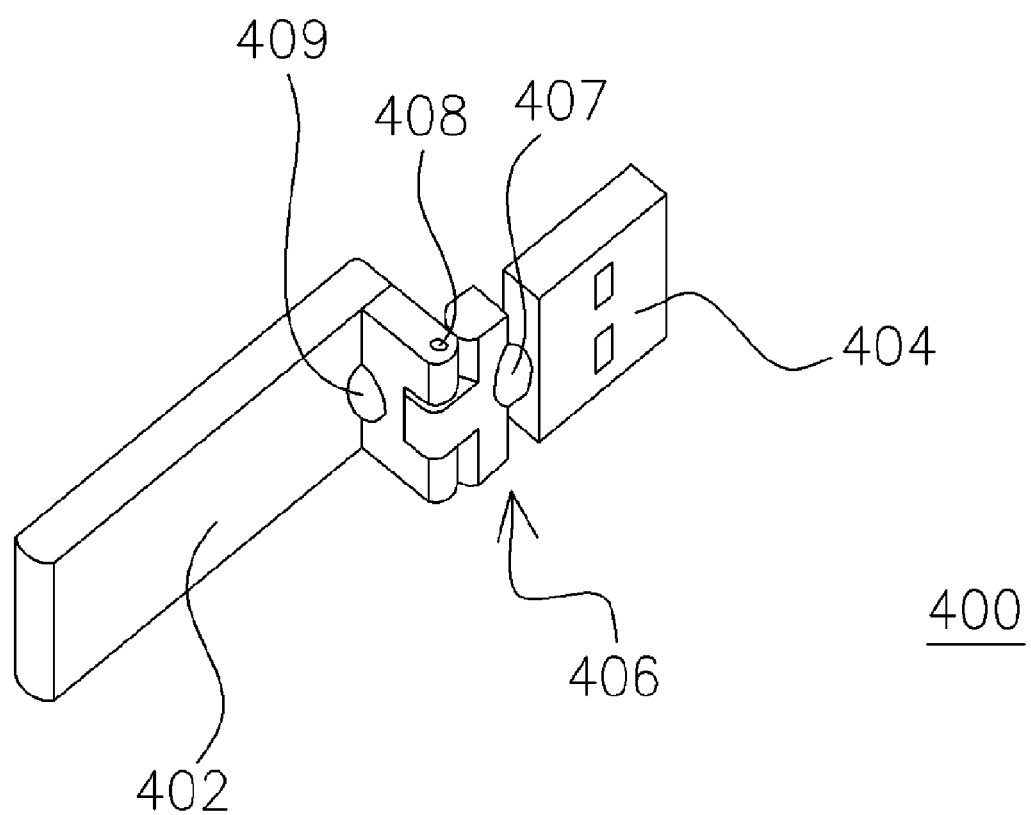
FIG. 8 is a perspective view showing an interface apparatus with an alternative rotational mechanism (three rotational junctions) according to the second embodiment of this invention.

FIG. 8 is a perspective view showing an interface apparatus with an alternative rotational mechanism (three rotational junctions) according to the second embodiment of this invention. As shown in FIG. 8, the number of rotational joints is also not limited to two and can be three. The rotational mechanism 406 has three rotational joints 407, 408 and 409. In general, when a multiple of rotational joints are used, the total degrees of freedom of the rotational mechanism is the sum of the degrees of freedom of each rotational joint.

FIG. 9 is a perspective view showing the sequence of steps for putting a notebook computer with attached interface apparatus all having rotational mechanism according to this invention into a briefcase to facilitate carriage. After using the notebook computer 210 to perform a few required operations, a user may change the relative positions between the body and the connector through the rotational and/or shifting motion provided by the rotational mechanism. In this way, the interface apparatus can dodge neighboring connectors or cables and minimize any damage due to external impact. Similarly, through the rotational and/or sliding function of the rotational mechanism, the body of the interface apparatus may be flipped to touch the casing on either side of at the back of the notebook computer 210. Thereafter, the notebook computer 210 together with the interface apparatus can be slipped into a protective cover or a briefcase to facilitate carriage.

In summary, the interface apparatus according to this invention has at least the following advantages.

1. The location of the body relative to the connector can be changed through the rotational and/or sliding function provided by the rotational mechanism of the interface apparatus for reducing impact damage.
2. Through the rotational and/or sliding function provided by the rotational mechanism, the body of the interface apparatus can be flipped to one side touching the edge of a notebook computer. Hence, the interface apparatus and the notebook computer can be slipped into a protective cover or a briefcase for ease of carriage.
3. With the rotational and/or sliding function provided by the rotational mechanism, the interface apparatus can be swiveled to untangle from neighboring connectors or cables.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An interface apparatus with a rotational mechanism for connecting with an interface port in an electronic product, the interface apparatus comprising:
   a body comprising a memory module;
   a connector for connecting with an interface port; and
   a rotational mechanism for linking the body and the connector,
   wherein the rotational mechanism has at least one rotational joint having two to five degrees of freedom of movements, such that the rotational mechanism has two to five degrees of freedom of movements.

2. The interface apparatus of claim 1, wherein the memory module comprises a non-volatile memory module.

3. The interface apparatus of claim 1, wherein the connector comprises a universal serial bus (USB) interface.

4. The interface apparatus of claim 1, wherein the connector comprises an IEEE 1394 interface.

5. The interface apparatus of claim 1, wherein the rotational joint is selected from a group consisting of a rotational joint a sliding joint, a rolling joint, a cam-wheel joint, a gear-wheel joint, a spiral joint, a cylindrical joint, a ball-and-socket joint and a plane-sliding joint.

* * * * *